ELECTRIC CURRENT RANGE CONVERTING AMPLIFIER

Filed Aug. 27, 1968

INVENTOR
MASAYOSHI TANAKA
BY
Arthur H. Swanson
ATTORNEY

United States Patent Office 3,544,882
Patented Dec. 1, 1970

3,544,882

ELECTRIC CURRENT RANGE CONVERTING AMPLIFIER

Masayoshi Tanaka, Tokyo, Japan, assignor to Honeywell, Inc., Minneapolis, Minn., a corporation of Delaware Filed Aug. 27, 1968, Ser. No. 755,601
Claims priority, application Japan, Aug. 30, 1967, 42/55,193
Int. Cl. G05f *1/56*
U.S. Cl. 323—4 2 Claims

ABSTRACT OF THE DISCLOSURE

A transistor amplifier circuit is provided which converts an input current signal in one range to an output current signal in another range. The amplifier includes an input control stage which features a signal amplifier transistor and a feedback signal amplifier transistor. The amplifier further includes an output stage transistor amplifier, the transistor of which is matched to the transistor of the feedback amplifier and so connected that the $V_{be}$ drop of the two transistors substantially cancel, making the amplifier circuit self-compensating with respect to temperature variations.

BACKGROUND OF THE INVENTION

This invention relates to an electric current converting circuit and, more particularly, to an electric current converting circuit which is capable of taking out one or a plurality of output currents corresponding to the input currents by combining two or more transistors of the same type.

Recently, there is a tendency that a direct current common power supply system is employed as the power supply source and regarding the supply voltage, a low voltage (for instance DC 24 v.) is generally used. In such a case, one or a plurality of output currents corresponding to the input currents are required for the object of operation or connection with other circuits, and besides the circuits concerned must operate sufficiently at relatively low voltages.

SUMMARY OF THE INVENTION

In this invention, a transistor is connected across a power source in series with a constant current source and a resistor, another transistor is connected across the power source in series with a load and a resistor, a current amplifying transistor is connected between the common connection of the bases of the two transistors, the collector of one of the two transistors.

A plurality of output currents are obtained in the load corresponding to the input currents in the constant current source.

Consequently, the object of this invention is to obtain an electric current converting circuit which is capable of taking out one or a plurality of output currents corresponding to the input currents and almost free from the effects of the variations of temperature and the fluctuations of the supply voltage.

DESCRIPTION OF THE PREFERRED EMBODIMENTS

Figures 1, 2:
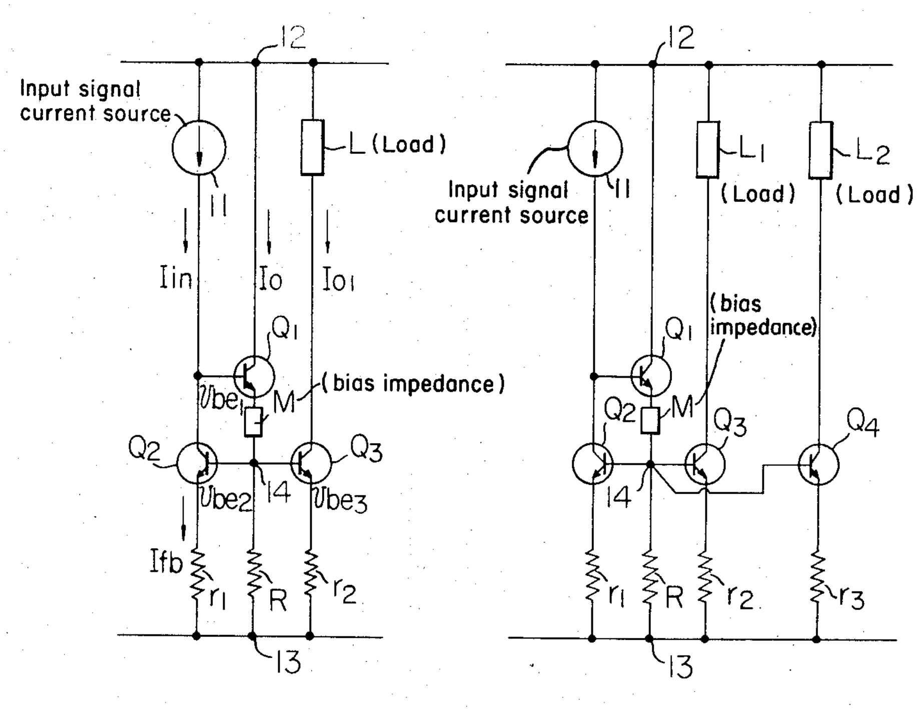
FIGS. 1 through 3 are schematic circuit diagrams of apparatus each embodying the present invention.

In FIG. 1, the output of a constant current circuit 11 is connected to the base of a transistor Q1 and the collector of a transistor Q2. The emitter of the transistor Q1 is connected to a joint 14 through a component M which is composed of a diode, a bias constant voltage diode or a resistor to obtain a voltage between the base and collector of the transistor Q2 and the base of the transistor Q2 is connected also to joint 14.

The collector of the transistor Q1 is connected to a terminal 12 which has a positive potential and the emitter of the transistor Q2 is connected to a terminal 13 which has a negative potential through a resistor $r_1$ which has a low resistance and is precisely adjusted.

A high resistor R such as a carbon resistor is connected between joint 14 and terminal 13.

An end of a load L is connected to the terminal 12 and the other end is connected to terminal 13 through the collector and emitter of a transistor Q3 and a precisely adjusted low resistor $r_2$. The base of the transistor Q3 is connected to joint 14.

In FIG. 1, the transistor Q1 constitutes a differential current amplifier, the transistor Q2 comprises a feedback constant current source and the transistor Q3 forms an output constant current source.

The operations of the circuit shown in FIG. 1 are as explained below. The transistor Q1 is driven by a differential current $I_{in}-I_{fb}$ which is the difference between the input current $I_{in}$ from constant current circuit 11 and the feedback current $I_{fb}$ flowing through the transistor Q2, the emitter current of the transistor Q1 flows through the component M into an output circuit which contains the resistor $r_2$ and a feedback circuit having the resistor R, and in the two circuits flow currents which correspond to the voltage drop developed across the resistor R.

The transistors Q2 and Q3 are of the same type having a high gain and when the gain of the feedback circuit is sufficiently large, the result is that the input current $I_{in}$ and the feedback current $I_{fb}$ become equal; therefore the output current $I_{o1}$ can be obtained from the following equation.

$$I_oR=V_{be2}+I_{fb}r_1=V_{be3}+I_{o1}r_2$$

where, $I_o$: Collector current of transistor Q1
$V_{be2}$: Voltage across the base and emitter of transistor Q2
$V_{be3}$: Voltage across the base and emitter of transistor Q3

In this case, it is desirable that there exist such relations as $R \gg r_1$ and at the same time $R \gg r_2$. This relation and the fact that the transistors are of the same type produce a condition whereby the voltages $V_{be}$ across the base and emitter and $h_{FE}$ of the transistors concerned are the same with respect to each other. As $V_{be2}$ and $V_{be3}$ are approximately equal, the following equation is obtained.

$$I_{o1}=\frac{r_1}{r_2}I_{fb}=\frac{r_1}{r_2}I_{in}$$

In the circuit connection diagram shown in FIG. 2, an output circuit consisting of a transistor Q4 and a low resistance $r_3$ is provided additionally in parallel from joint 14 to obtain another load circuit. By this means, it is possible to take out a plurality of outputs.

Figure 3:
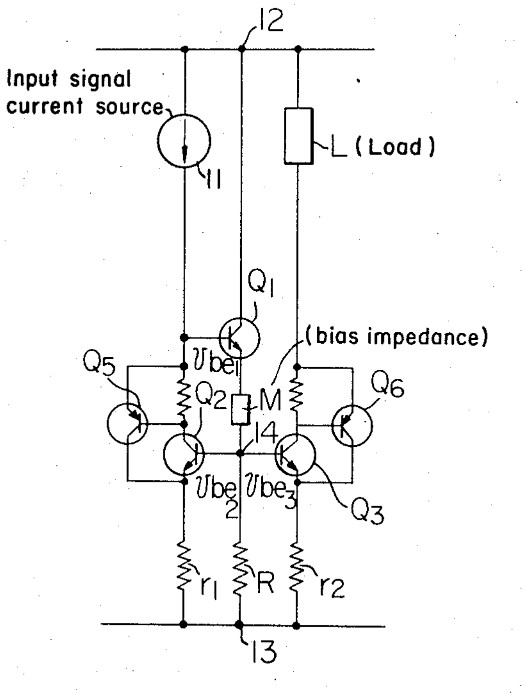

FIG. 3 shows a circuit connection diagram which eliminates the condition of the agreement of $h_{FE}$ by using transistors Q5 and Q6 for the respective complementary connection of the transistors Q2 and Q3 of the circuit connection diagram shown in FIG. 1. As this connection works so as to obtain the relation $V_{be2}-V_{be3}$, in the practical operation the effect of $V_{be}$ can be ignored when compared with the voltage drops of the low resistances $r_1$ and $r_2$ and the voltage $V_{be1}$ across the base and emitter of the transistor Q1 can be ignored because of the large output impedances of the input signal source and feedback signal source. Therefore, this circuit has an excellent characteristic against the load variations and power supply voltage fluctuations.

Since a current amplifier which is composed of a transistor Q1 and a component M such as a diode, resistor or Zener diode amplifies the differential current between the input current $I_{in}$ and the feedback current $I_{fb}$ and works to supply the amplified current to the high resistance R, the current amplifier has the advantage that it can be composed simply of only one transistor and one component M. However, there is not need to limit the current amplifier to the type shown in the figure. It is needless to say that, if necessary, amplifier of other circuit constructions may be employed.

What is claimed is:

1. An electric current converting circuit which is capable of producing a plurality of output current signals corresponding to an input current signal, said circuit comprising:

a constant current input signal means,
a first transistor,
a first resistor,
said first transistor and said resistor being connected in series with said input signal means between a first and a second power supply lead,
a second transistor,
a second resistor,
an output lead means,
said second transistor being of the same type as said first transistor and being connected in series with said lead means and said second resistor between said first and second power supply leads,
the control electrode of said first and second transistor being directly connected together at a junction,
a third transistor,
a bias impedance means, and
a third resistor,
said third transistor being connected in series with said bias impedance means and said third resistor between said first and second power supply leads, the common connection between said bias impedance means and said third resistor being connected to said junction, the control electrode of said third transistor being connected to the common connection point between said input signal means and said first transistor.

2. The invention as set forth in claim 1 and characterized by the addition of a fourth transistor,
a fourth resistor, and
a second output load means
said fourth transistor being of the same type as said first transistor and being connected in series with said second load means and said fourth resistor between said first and second power supply leads, the control electrode of said fourth transistor being connected to said junction.

References Cited

UNITED STATES PATENTS 3,237,087 2/1966 Greenberg ------- 323—22(T)

OTHER REFERENCES

Ottesen, "Precision Current Source Independent of Supply Voltage," IBM Technical Disclosure Bulletin, vol. 7, No. 10, March 1965, p. 874 (323–4).

J D MILLER, Primary Examiner

A. D. PELLINEN, Assistant Examiner

U.S. Cl. X.R.

307—32, 296